United States Patent
Sakumoto et al.

[11] Patent Number: 5,824,182
[45] Date of Patent: Oct. 20, 1998

[54] ADHESIVE TAPES

[75] Inventors: Yukinori Sakumoto; Shigeyuki Yokoyama; Akihiro Shibuya; Atsushi Koshimura, all of Shizuoka, Japan

[73] Assignee: Tomoegawa Paper Co., Ltd., Tokyo, Japan

[21] Appl. No.: 433,243

[22] Filed: May 2, 1995

Related U.S. Application Data

[62] Division of Ser. No. 417,457, Apr. 5, 1995, which is a continuation of Ser. No. 137,608, Oct. 14, 1993, which is a division of Ser. No. 814,236, Dec. 23, 1991, Pat. No. 5,277,972, which is a continuation of Ser. No. 414,012, Sep. 28, 1989, abandoned.

[30] Foreign Application Priority Data

| Sep. 29, 1988 | [JP] | Japan | 63-242265 |
| Nov. 15, 1988 | [JP] | Japan | 63-286832 |
| Feb. 23, 1989 | [JP] | Japan | 1-41637 |
| Feb. 23, 1989 | [JP] | Japan | 1-41638 |

[51] Int. Cl.⁶ .................................................. H05K 7/14
[52] U.S. Cl. ............................................. 156/300; 29/876
[58] Field of Search ........................... 156/300, 47, 51, 156/52, 55; 29/876

[56] References Cited

U.S. PATENT DOCUMENTS

| 3,421,961 | 1/1969 | Joyce | 156/300 X |
| 3,784,496 | 1/1974 | Smith et al. | 260/29.3 |
| 3,837,984 | 9/1974 | Wagner et al. | 161/53 |
| 3,873,638 | 3/1975 | Olson | 260/837 R |
| 3,917,554 | 11/1975 | Inoue et al. | 260/30.4 |
| 4,212,912 | 7/1980 | Wartusch et al. | 428/209 |
| 4,347,286 | 8/1982 | Izshizuka et al. | 428/349 |
| 4,435,543 | 3/1984 | Ema et al. | 525/143 |
| 4,456,496 | 6/1984 | Suter et al. | 156/249 |
| 4,578,315 | 3/1986 | Santorelli | 428/414 |
| 4,762,747 | 8/1988 | Liu et al. | 428/343 |
| 4,861,648 | 8/1989 | Kleinschmidt et al. | 428/40 |
| 4,862,245 | 8/1989 | Pashby et al. | 357/70 |
| 4,892,602 | 1/1990 | Oike et al. | 156/233 |
| 4,977,003 | 12/1990 | Brown et al. | 428/35.5 |
| 5,118,567 | 6/1992 | Komiyama et al. | 428/345 |
| 5,277,972 | 1/1994 | Sakumoto et al. | 428/355 |

FOREIGN PATENT DOCUMENTS

| 2168495 | 8/1973 | France . |
| 35-12939 | 9/1960 | Japan . |
| 52-14745 | 4/1977 | Japan . |
| 55-15826 | 2/1980 | Japan . |
| 59-108072 | 6/1984 | Japan . |
| 57146337 | 3/1986 | Japan . |
| 61-051076 | 3/1986 | Japan . |
| 63-110034 | 7/1988 | Japan . |
| 2070460 | 9/1981 | United Kingdom . |

OTHER PUBLICATIONS

Kazuhiro Takasusuki, Polyimide Resins, Feb. 25, 1991, *KK Gijytusu Jyoho Kyokai* (*Technical Information Society Co., Ltd.*), ISBN4–906317–16–2C3058, excerpted from pp. 34 to 37 (w/partial translation).

Examination of Japanese Patent Publication No. Hei 1–41638 (English Language Summary), Filed: Feb. 23, 1989, OA Issued: Feb. 8, 1994.

(List continued on next page.)

*Primary Examiner*—Francis J. Lorin
*Attorney, Agent, or Firm*—Darby & Darby

[57] ABSTRACT

An adhesive tape for electronic parts, comprising (a) a heat resistant base film, and (b) an adhesive layer laminated on at least one surface of said base film, said adhesive layer comprising
  (i) a resol type phenol resin, and
  (ii) an acrylonitrile/butadiene copolymer,
in a proportion of from 100 to 500 parts by weight of said resol type phenol resin per 100 parts by weight of said acrylonitrile/butadiene copolymer, said resol type phenol resin being selected from the group consisting of bisphenol A type resins, alkylphenol type resins, phenol type resins and their co-condensed type phenol resins which contain as the phenol component at least one member selected from the group consisting of bisphenol A, alkylphenols and phenol.

5 Claims, 3 Drawing Sheets

OTHER PUBLICATIONS

Examination of Japanese Patent Publication No. Sho 63–286832 (English Language Summary), Filed: Nov. 15, 1988, OA Issued: OA Issued: Jan. 11, 1994.

Examination of Japanese Patent Publication No. Hei 1–41637 (English Language Summary), Filed: Feb. 23, 1989, OA Issued: Feb. 2, 1994.

Examination of Japanese Patent Publication No. Sho 63–242265 (English Language Summary), Filed: Jan. 29, 1988, OA Issued: Jan. 25, 1994.

Excerpt from "Plastics Reader", Plastic Technology Research Society, Kabushiki Kaisha Plastics Age, Apr. 20, 1969.

M. Uenaka, Phenol Resins, Plastics Technology Overview, Industrial Research Society, vol. 15, pp. 102–109.

Decision of Opposition with Translation—Japanese Patent Appln SN 63–242265 (Publication No. 6–68100).

William Gardner, "Handbook of Chemical Synonyms and Trade Names", cover page and one page of the contents.

ADHESIVE TAPES

This is a division, of application Ser. No. 08/417,457, filed Apr. 5, 1995, which is a continuation of application Ser. No. 08/137,608, filed Oct. 14, 1993, which is a division of application Ser. No. 07/814,236, filed Dec. 23, 1991, now issued U.S. Pat. No. 5,277,972, issued Jan. 11, 1994, which is a continuation of application Ser. No. 07/414,012, filed Sep. 28, 1989, now abandoned.

BACKGROUND OF THE INVENTION

1. Field of the Invention

This invention relates to adhesive tapes for electronic parts, for example resin-sealed-type semiconductor devices, in particular, those used for fixing inner lead pins for lead frames in resin-sealed-type semiconductor devices.

2. Description of Prior Art

Adhesive tapes used in resin sealed semiconductor devices include tapes for fixing lead frames, die pad tapes, tab tapes and the like. In the case of, for example, adhesive tapes for fixing lead frames, the adhesive tapes are used for fixing inner lead pins and for increasing the yield and productivity of the lead frames themselves and of the whole assembly procedures for the manufacture of the semiconductor devices, and therefore they are generally attached on the lead frames by the manufacturer of the lead frames and conveyed to the manufacturer of semiconductor devices where they are sealed with a resin after mounting integrated circuits (IC's). In other words, the adhesive tapes are incorporated in the package of the semiconductor devices. Therefore, adhesive tapes, for example, those for fixing the lead frames are required to have adhesion strength high enough not only at room temperature immediately after the taping but also after heating in IC assembly procedure as well as general reliability on the level of semiconductors and operability or ease of handling at the time of taping.

Heretofore, there have been used as the adhesive tapes for fixing inner lead pins of the lead frames various adhesive tapes including, for example, those composed of a base film such as polyimide film on which an adhesive is coated which comprises polyacrylonitrile resin, polyacrylate resin or synthetic rubber resins such as acrylonitrile/butadiene copolymers alone or modified or mixed with other resins, and converted to the B stage.

As is well known, semiconductor devices are subjected to reliability tests under severe conditions such as in pressure cooker test (hereafter, "PCT"). Naturally, the adhesive tapes for fixing the lead frames in the resin molded package must surely have enough reliability under the same conditions. Among various reliabilities which the materials used in the semiconductor devices must have, particularly important for adhesive tapes for fixing lead frames is electric current leak characteristics. This corresponds to a phenomenon that electric current flows through the tape portion where the adhesive tape for fixing lead frame is attached, and smaller quantity of the electric current means better electric current leak characteristics.

On the other hand, there has recently remarkable improvement in the degree of integrity of semiconductor elements and also miniaturization of semiconductors has been proceeding rapidly, resulting in that the number of lead frame pins has increased and the respective inner inner lead pins of the lead frames have become thinner and there is a tendency that the distance between the pins become shorter. This leads to severer requirement for the accuracy of the positioning of the respective pins.

Under the circumstances, the semiconductor devices with the conventional adhesive tapes for fixing the lead frames do not show sufficient insulation properties between the inner lead pins and thus their electric current leak characteristics are poor. Moreover, it has been quite unclear which factors the electric current leak characteristics of the conventional adhesive tapes depend upon and how they can be improved.

SUMMARY OF THE INVENTION

Accordingly, it is an object of this invention to provide adhesive tapes for electronic parts having improved electric current leak characteristics.

With view to overcoming the defects of the conventional adhesive tapes, intensive investigation has been made by the present inventors on the relationship between the composition and various properties of the adhesive tapes and the electric current leak characteristics using a heat resistant base film having approximately acceptable electric current leak characteristics as a support and an adhesive layer composed of generally called acrylonitrile/butadiene copolymer/phenolic resin coated on the surface of the base film, and as the result, it has now been found that the above object can be achieved using adhesive tapes with specified compositions.

This invention is based on the above discoveries and provides an adhesive tape for electronic parts, comprising
   (a) a heat resistant base film, and
   (b) an adhesive layer laminated on at least one surface of said base film, said adhesive layer comprising
      (i) a resol type phenol resin, and
      (ii) an acrylonitrile/butadiene copolymer,
in a proportion of from 100 to 500 parts by weight of said resol type phenol resin per 100 parts by weight of said acrylonitrile/butadiene copolymer, said resol type phenol resin being selected from the group consisting of bisphenol A type resins, alkylphenol type resins, phenol type resins and their co-condensed type phenol resins which contain as the phenol component at least one member selected from the group consisting of bisphenol A, alkylphenols and phenol.

DETAILED DESCRIPTION OF THE INVENTION

Figure 1:
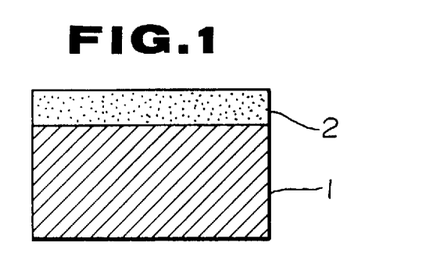
FIG. 1 is a schematical cross-sectional view of the adhesive tape for electronic parts according to this invention, in which the adhesive layer is laminated on one surface of the heat resistant base film.
Figure 2:
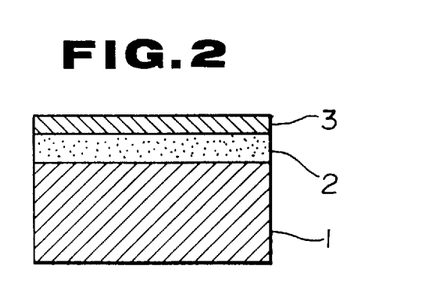
FIG. 2 is a schematical cross-sectional view of the adhesive tape for electronic parts according to this invention, in which the adhesive layer is laminated on one surface of the heat resistant base film and a protective layer is further laminated on the adhesive layer.
Figure 3:
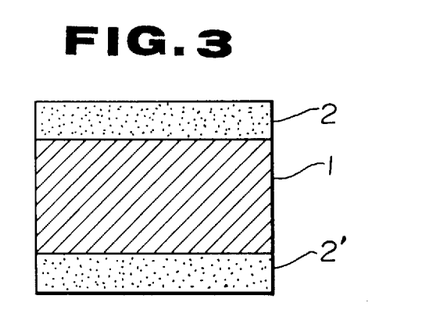
FIG. 3 is a schematical cross-sectional view of the adhesive tape for electronic parts according to this invention, in which the adhesive layer is laminated on each surface of the heat resistant base film.
Figure 4:
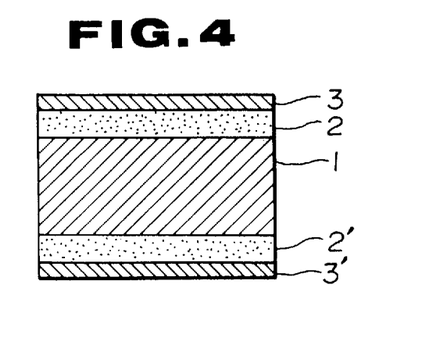
FIG. 4 is a schematical cross-sectional view of the adhesive tape for electronic parts according to this invention, in which the adhesive layer is laminated on each surface of the heat resistant base film and a protective layer is further laminated on the respective adhesive layers.

Hereinafter, this invention will be described in detail with reference to the attached drawings, in which FIGS. 1 through 4 are schematical cross-sectional views of adhesive tapes for electronic parts according to this invention In FIGS. 1 and 2, a heat resistant base film 1 is laminated on one surface thereof with an adhesive layer 2. In FIG. 2, a protective laser 3 is further laminated on the surface of the adhesive layer 2. In FIGS. 3 and 4, adhesive layers 2 and 2' are laminated on the opposite surfaces of the heat resistant base film 1. In FIG. 4, protective layers 3 and 3' are laminated on the adhesive layers 2 and 2', respectively.

The construction of the respective layers of the adhesive tape of this invention will be explained hereafter.

A. Heat Resistant Base film

As the heat resistant base film, there can be used organic base film, more particularly heat resistant base films composed of polyimides, polyether-ether-ketones, polyetherimides, polyphenylene sulfides, and polyparabic acid, and composite heat resistant base films such as epoxy resin-glass cloth, and epoxy resin-polyimide-glass cloth, which base films have a thickness of from 5 to 300 µm, preferably from 10 to 150 µm, more preferably 12.5 to 150 µm, and most preferably 25 to 75 µm.

B. Adhesive Layer

The adhesive layer is composed of a mixture of an acrylonitrile/butadiene copolymer (hereafter, "NBR") and a resol type phenol resin.

As NBR, there can be used a nitrile rubber having a relatively high nitrile content as high as from 10 to 45% by weight, preferably from 20 to 45% by weight and a molecular weight of from 20,000 to 1,000,000, preferably from 100,000 to 500,000. The NBR may optionally contain a vulcanizing agent such as quinones, dialkyl peroxides, and peroxyketals in order to exhibit self cross-linking property upon heating.

The resol type phenol resin includes bisphenol A type resins, alkylphenol type resins, phenol type resins and their co-condensed type phenol resins which contain as the phenol component at least one member selected from the group consisting of bisphenol A, alkylphenols and phenol.

As the resol type phenol resin in which the phenol component is bisphenol A, there can be used those which are synthesized using bisphenol A as a starting compound and which have the following basic skeleton and whose softening point as measured by the ring and ball method is from 70° to 90° C.

As the resol type phenol resin in which the phenol component is the alkylphenol, there can be used those which are synthesized using as a starting compound an alkylbenzene having an alkyl group mainly at the ortho- or para-position to the phenolic hydroxyl group. Examples of the alkyl group include a methyl group, an ethyl group, a propyl group, a t-butyl group, a nonyl group, and the like. For example, there can be used p-t-butylphenol type resol phenol resins which have the following basic skeleton and whose softening point as measured by the ring and ball method is from 80° to 100° C.

The resol type phenol resins in which the phenol component is phenol are those which are synthesized using unsubstituted phenol and formaldehydes as starting compounds.

When the above-described resol type phenol resins are used in the adhesive layer, the resulting adhesive tapes exhibit excellent operability and adhesion and also good electric current leak characteristics.

In the adhesive layer of the adhesive tape of this invention, the phenol component of the resol type phenol resin may contain other phenol components, for example, phenol resins of co-condensed type derived from p-phenylphenol type or biphenyl type phenols. Also, a small amount of novolak type phenol resin or epoxy resin may be blended with the resol type phenol resin.

Fillers can be mixed with the resol type phenol resins, if desired.

The proportion of the resol type phenol resin to NBR in the adhesive layer is from 50 to 500 parts by weight, preferably from 100 to 500 parts by weight, more preferably 100 to 300 parts by weight, per 100 parts by weight of NBR. When the content of the resol type phenol resin is less than 50 parts by weight per 100 parts by weight of NBR, the leak current value is too high to be acceptable and when it is more than 500 parts by weight per 100 parts by weight of NBR, adhesive tapes having sufficient adhesion and good operability cannot be obtained.

In this invention, the adhesive layer having the above-described composition has a dry and after B-stage coating thickness of from 2 to 50 µm, preferably 7 to 30 µm, and more preferably 10 to 30 µm.

C. Protective layer

The adhesive tape for electronic parts of this invention may be provided with a protective layer on the adhesive layer, if desired As the protective layer, there can be used polyethylene film, polyethylene terephthalate film, polypropylene film, fluororesin film, paper and the like, which may be imparted peeling property with silicone resin or the like, if desired. The protective layer has a thickness of from 1 to 200 µm, preferably from 5 to 100 µm, more preferably from 10 to 100 µm, and most preferably from 12.5 to 50 µm.

When the adhesive tape for electronic parts of this invention has a construction such that the adhesive layer is laminated on one surface of the heat resistant base film, the tape preferably has the following characteristics (1), (2) and (3).

(1) The electric conductivity of an extract containing organic and inorganic ionic impurities extracted from the adhesive tape under the conditions set forth below is not higher than 70 µs/cm.

(2) The concentration of sulfate ions in the adhesive tape for electronic parts is not higher than 300 ppm.

(3) When the surface of the heat resistant base film is brought in contact with the molding compound, the adhesive tape has an adhesion strength of not lower than 200 g/1.5 cm upon 180° peeling test.

In this invention, the above-described characteristics (1), (2) and (3) refer to those measured under the following conditions.

1) Conditions for Measuring Electric Conductivity 1-a) Conditions for Pretreatment of Tapes The adhesive tape, after stripping off the protective layer, if any, is cut to pieces of a size of about 1 cm square, with care lest the tape should be contaminated with ionic impurities.

1-b) Conditions for Extraction 1-b-1) In a sufficiently washed heat resistant round bottom glass flask is charged 10 g of a sample and 100 g of deionized water having an electric conductivity of not higher than 5 µs/cm is added thereto.

1-b-2) To the glass flask is fitted a sufficiently washed reflux condenser and the content is heated at 100° C. and left to stand for 20 hours.

1-c) Conditions for Measurement the electric conductivity of the extract is measured using a conductometer.

2) Conditions for Measurement of Concentration of Sulfate Ions 2-a) Conditions for Pretreatment of Tapes The adhesive tape, after stripping off the protective layer, if any, is cut to pieces of a size of about 3 cm square, with care lest the tape should be contaminated with ionic impurities.

2-b) Conditions for Preparing Samples for Measurement

The sample (1 g) after the above-described pretreatment is burnt by oxygen bomb or cylinder method and absorbed in 25 ml of deionized water to form a sample solution.

2-c) Conditions for Measurement

The concentration of sulfate ions in the sample solution is determined by means of ion chromatography, and the results obtained are converted into the concentration of the sample.

3) 180° Peeling Test 3-a) Preparation of Samples for Measurement 3-a-1) After peeling off the protective layer, if any, the sample tape is adjusted to a size of 15 mm in width×150 mm in length.

3-a-2) On a metal plate as a support is placed a molding compound before curing so as to have a uniform thickness.

3-a-3) On the surface of the molding compound is bonded the sample tape prepared in 3-a-1) above at its surface to be measured, and is heated at 120° C., followed by pressing with a roll of a self-weight of 2 kg.

3-a-4) The sample prepared in 3-a-3) above is heated at 175° C. for 5 hours in a drier to cure the molding compound to form a sample for measuring adhesion to the molding compound 3-b) PCT Conditions Using a saturated type pressure-cooker tester, the above-described sample is treated for 50 hours under the conditions of 121° C. and 2 atm.

3-c) Method for Measurement

The 180° peeling strength of the sample is measured using a universal testing machine.

In the adhesive tape for electronic parts of this invention, its electric current leak characteristics is excellent when the above-described characteristics are satisfied. For example, satisfactory electric current leak characteristics are obtained when the adhesive tape is applied to quad flat package (QFP) with not less than 168 pins and the like. In addition, when the above-described characteristics (3) is satisfied, the fluctuation of the measured values of the electric current leak can be minimized.

DESCRIPTION OF PREFERRED EMBODIMENTS

I. In a preferred embodiment this invention, a combination of the acrylonitrile/butadiene copolymer having a specified molecular weight distribution and a specified resol type phenol resin is used.

That is, as the resol type phenol resin is used a resin selected from the group consisting of bisphenol A type resins, alkylphenol type resins and their co-condensed type phenol resins which contain as the phenol component at least one member selected from the group consisting of bisphenol A, and alkylphenols. On the other hand, as the acrylonitrile/butadiene copolymer, there is used one which has a number average molecular weight (MN) of from 20,000 to 200,000 and the ratio of its weight average molecular weight (MW) to its number average molecular weight (MN) is in the range of MW/MN≧2.5.

In this embodiment, the molecular weight is measured by gel permeation chromatography (GPC) under the conditions shown in Table 1 below.

TABLE 1

| Item | Conditions |
|---|---|
| Eluant | Tetrahydrofuran |
| Detector | RI |
| Column | SHODEX GPC KF-80M × 2 (Hard, spherical porous polystyrene gel) |
| Temperature | Room temperature |
| Method of determining calibration curve in terms of polystyrene | Calibration curve is prepared standard polystyrene gel manufactured by Toyo Soda Manufacturing Ltd. having the following molecular weights: 3,840,000, 775,000, 107,000, 16,700, 2,800. |

When the number average molecular weight of the acrylonitrile/butadiene copolymer is less than 20,000, the surface of the adhesive layer after being converted to B-stage becomes relatively sticky and the improvement in the surface property is not noticeable. On the other hand, when it is more than 200,000, improvement in the adhesion of the adhesive tape, particularly that when the adhesive tape is bonded at low temperatures, is unsatisfactory. Also, no further improvement in the adhesion is obtained with the ratio of the weight average molecular weight to the number average molecular weight (MW/MN) being outside the above-defined range.

In this embodiment, the acrylonitrile/butadiene copolymer may have one or more peaks of GPC chromatogram in its molecular weight distribution.

Also, in this embodiment, it is preferred to use the resol type phenol resin in an amount of from 50 to 300 parts by weight per 100 parts by weight of the acrylonitrile/butadiene copolymer. With the content of the resol type phenol resin per 100 parts by weight of NBR being less than 50 parts by weight, the blocking of the surface of the adhesive layer increases and when it is more than 300 parts by weight, decrease in the adhesion strength is observed.

Other conditions may be the same as described above.

In this embodiment, among various properties required for the adhesive tapes for use in resin sealed type semiconductor devices, are particularly improved the adhesion strength immediately after taping and that after thermal hysteresis, which is encountered by the adhesive tapes attached on the lead frame when the semiconductors are subjected to die bonding procedure in which the semiconductor chips are bonded to the lead frames at a temperature of from 150° to 250° C. for from 1 to 3 hours or when they are subjected to wire bonding procedure in which the extreme point of the inner lead of the lead frame is connected to the wiring pad on the semiconductor chip with a gold wire at a temperature of from 150° to 350° C. for from about 1 to about 30 minutes.

II. In another preferred embodiment, the heat resistant base film is used which has additionally the following properties.

Coefficient of thermal expansion: an average coefficient of linear thermal expansion along the width thereof at from 20° to 300° C. (as measured according to ASTM D-696-44) of from $0.4 \times 10^{-5}$ to $2.5 \times 10^{-5}$ cm/cm/° C.

Degree of thermal shrinkage: coefficient of dimensional change along the width thereof after heating at 300° C. for 3 minutes (as measured according to JIS C2318-6.3.5) being not higher than 0.15%.

(1) Coefficient of thermal expansion

As the material for the heat resistant base film, the same material as described above can be used. However, the following treatments are conducted for obtaining the average coefficient of linear thermal expansion defined as above because various organic films generally have average coefficient of thermal expansion at from 20° to 300° C. which is in the range of $1.0 \times 10^{-5}$ to $15 \times 10^{-5}$ cm/cm/° C., and therefore almost all of them except for only a part of them have the average coefficient outside the above-described range required for this preferred embodiment.

(1-i) An inorganic filler is added to the organic base film.

(1-ii) As the main component material for constituting the organic base film, there is used one having a low coefficient of thermal expansion, for example, a polyimide based material containing a repeating unit having the following formula:

(2) Degree of Thermal Shrinkage

Generally, the thermal shrinkage of various organic films is caused by the following two causes.

(2-1) In the organic films based on epoxy resin, polyimide or the like thermosetting resin, heat curing reaction of the resin constituting the film is not sufficient and therefore the film shrinks upon subsequent heating.

(2-2) When the resin is stretched to form a film, deforming stress is generated in the film due to stretching or the like, and the deforming stress is relaxed by heating to cause the film to shrink.

Therefore, the thermal shrinkage due to the heating during the assembly step can be reduced to a value within the above-described range by subjecting the film to preliminary heat treatment. The heat treatment can be conducted, for example, by passing the organic films through two opposing infrared heaters or passing between a plurality of heated rolls heated at a temperature of from 280° to 360° C. for from 1 to 10 minutes with keeping the films in contact with the surface of the rolls.

According to this preferred embodiment, the so-called lead shift caused by the deviation of the positions of the inner lead pins due to the thermal hysteresis encountered during the assembly procedure of the semiconductor devices as explained above.

Figure 5:
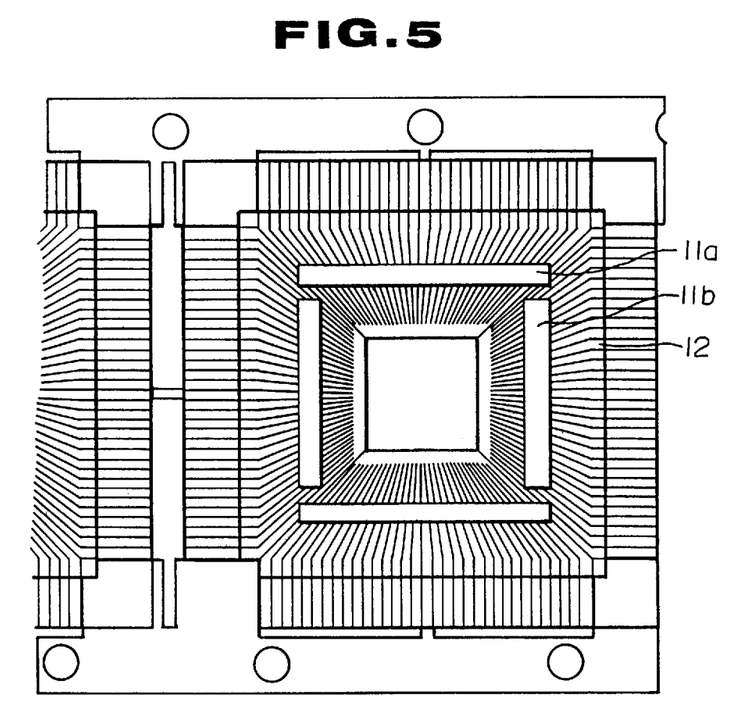
FIG. 5 is a plan view of a lead frame illustrating the state in which an adhesive tape is attached on the lead frame.
Figure 6:
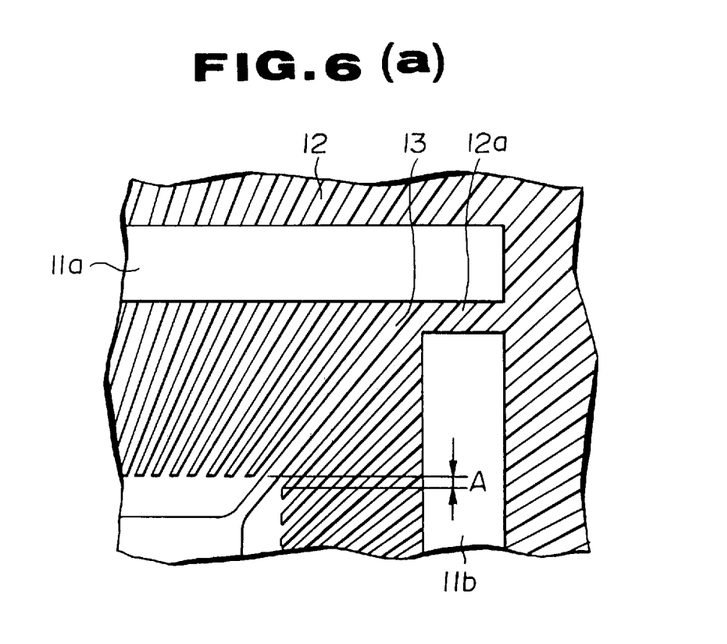
FIGS. 6(a) and 6(b) are partial enlarged view of the lead frame shown in FIG. 6.

The lead shift phenomenon is explained with reference to the attached drawings in which FIG. 5 illustrates a 4-directional multi-pin lead frame on which an adhesive tape for fixing the lead frame is attached. In FIG. 5, the adhesive tapes 11a and 11b are attached to the inner lead pins 12 so as to substantially form a square. FIGS. 6(a) and 6(b) are partial enlarged views of the lead frame shown in FIG. 5. FIG. 6(a) shows the state before the lead frame undergoes the thermal hysteresis, and FIG. 6(b) shows the state after the lead frame undergoes the thermal hysteresis. In FIGS. 6(a) and 6(b), the adhesive tapes 11a and 11b are attached to the inner lead pins 12 so as to substantially form a square. Reference numeral 13 indicates a support bar which is connected to the die pad of the lead frame. When heated at 300° C. for 3 minutes, the lead frame in the state shown in FIG. 6(a) the distance between the support bar 13 and the inner lead pin 12a adjacent thereto (indicated by symbol A in FIG. 6(a) and by B in FIG. 6(b)) is extended as shown in FIG. 6(b), thus causing deviation of the positions of the inner lead pins. As the result, the wire bonding step in which the semiconductor chips and the inner lead pins are connected to each other cannot be conducted appropriately. This leads to decrease in the efficiency of the wire bonding step during the assembly procedure, or to short-circuit between the wirings caused by the shifted inner lead pin contacting the adjacent inner lead pin, resulting in that the semiconductor device is no longer usable.

As stated above, this problem which would otherwise occur can be prevented with the above-described countermeasure according to the preferred embodiment of this invention.

III. In a still another embodiment of this invention, the adhesive layer further contains an organic or inorganic filler.

Examples of the inorganic filler which can be used include pulverized silica, molten silica, alumina, titanium oxide, beryllium oxide, zirconium oxide, magnesium oxide, titanium nitride, boron nitride, silicon nitride, titanium boride, tungsten boride, silicon carbide, titanium carbide, zirconium carbide, molybdenum carbide, and these substances treated on their surfaces with a trimethylsiloxyl group or the like. As the organic filler, there can be cited polyimides, resol phenol resins, epoxy resins, acrylic resins, styrene resins, silicone resins, nylons, polyamindeimides, polyether-ether-ketones, polyetherimides, polyesterimides, and the like. The organic and inorganic fillers may have an average particle size of from 0.1 to 50 μm. However, it is preferred that the maximum particle size thereof does not exceed the thickness of the adhesive layer.

In this embodiment, the organic or inorganic filler must be contained in the adhesive layer in an amount of from 0.5 to 80% by weight based on the total weight of the adhesive layer. When the amount of the filler is less than 0.5% by weight, the effect of the filler is not obtained. On the other hand, the adhesive layer becomes brittle, thus failing to give appropriate operability when the amount of the filler is more than 80% by weight.

The adhesive layer used in this embodiment can be prepared by mixing the adhesive with the filler by agitating them with a sand mill, three-roll mill, Bambury mixer or the like, or by dispersing them using a disperser, and coating the resulting mixture in a thickness of from 1 to 150 $\mu$m, preferably from 5 to 50 $\mu$m, and curing it to B-stage. Various thermoplastic resins such as polyether-ether-ketones, polyesters, polyamideimides and the like can be added alone or as a blend with the thermosetting resin.

The addition of the organic or inorganic filler in the adhesive layer is useful in controlling the dielectric constant and adhesive properties of the adhesive used as well as improving the lead shift characteristics as described above.

EXAMPLES

This invention will be described in greater detail with reference to the following examples. However, the invention should not be construed as being limited thereto. Unless otherwise indicated specifically, all parts and percentages are by weight.

EXAMPLE 1

Using materials shown in Table 2 below and methyl ethyl ketone (hereafter, "MEK") as a solvent, adhesive solutions 1 through 8 are prepared which have blend ratios shown in Table 3 below.

TABLE 2

| Resin | Trade Name | Manufacturer |
| --- | --- | --- |
| NBR (1) | NB56 | Nippon Zeon Co., Ltd. Note 1 |
| NBR (2) | NIPOL 1001 | Nippon Zeon Co., Ltd. Note 2 |
| Phenol resin (1) | CKM-908 | Showa Kobunshi Kogyo Co., Ltd. Note 3 |
| Phenol resin (2) | Tackirol 201 | Taoka Kagaku Kogyo Co., Ltd. Note 4 |
| Phenol resin (3) | BKM-2620 | Showa Kobunshi Kogyo Co., Ltd. Note 5 |
| Phenol resin (4) | KP732 E-2 | Arakawa Kagaku Kogyo Co., Ltd. Note 6 |

Note 1: NBR synthesized by Nippon Zeon Co., Ltd. The polymerization catalyst, pH adjusting agent after the polymerization and the like are considered. Particularly, the concentrations of calcium ions and of sulfate ions are lowered. Mooney viscosity: 50, bonded acrylonitrile content: 37%.
Note 2: NBR synthesized by Nippon Zeon Co., Ldt. which has the following properties. Mooney viscosity: 78, bonded acrylonitrile content: 41%.
Note 3: Bisphenol A type resol phenol resin produced by Showa Kobunshi Kogyo Co., Ltd., having a softening point of 73 to 90° C.
Note 4: Alkylphenol type resol phenol resin produced by Taoka Kagaku Kogyo Co., Ltd., having a softening point of 75 to 90° C.
Note 5: Cresol type resol phenol resin produced by Showa Kobunshi Kogyo Co., Ltd., having a softening point of 80 to 100° C.
Note 6: Resol phenol resin produced by Arakawa Kagaku Kogyo Co., Ltd. which is a liquid low molecular weight resin containing phenol type structure as a basic structure, having the following properties. Volatile component with methanol/isopropyl alcohol about 3.5%. Viscosity at 25° C.: 245 cps. Gelling time at 140° C.: about 8 minutes.

TABLE 3

| Adhesive solution Number | Blend Ratio of Materials (Parts by Weight) | | | | | | |
| --- | --- | --- | --- | --- | --- | --- | --- |
| | NB56 | NIPOL 1001 | CKM-908 | Tacki-rol 201 | BKM 2620 | KP732 E-2 | MEK. |
| 1 | 100 | — | 200 | — | — | — | 500 |
| 2 | 100 | — | — | 200 | — | — | 500 |
| 3 | 100 | — | — | — | 200 | — | 500 |
| 4 | 100 | — | — | — | — | 200 | 500 |
| 5 | — | 100 | 200 | — | — | — | 500 |
| 6 | — | 100 | — | 200 | — | — | 500 |
| 7 | — | 100 | — | — | 200 | — | 500 |
| 8 | — | 100 | — | — | — | 200 | 500 |

The resulting adhesive solutions 1 through 8 are coated on one surface of respective polyimide films having a thickness of 50 $\mu$m ("Kapton 200H", produced by E. I. Du Pont De Nemours) to a thickness of 20±3 $\mu$m, and dried at 150° C. for 5 minutes to prepare adhesive tapes 1 through 8. These adhesive tapes are used for measuring electric current leak characteristics, and the electric conductivity, concentration of sulfate ions and adhesion to the molding compound are measured in the above-described manner. The results obtained are shown in Table 4 below.

TABLE 4

| Adhesive Tape Number | Electric Conductivity ($\mu$s/cm) | Concentration of Sulfate Ions (ppm) | Adhesion to Molding Material (kg/1.5 cm) |
| --- | --- | --- | --- |
| 1 | 40 | 220 | 420 |
| 2 | 35 | 200 | 420 |
| 3 | 45 | 140 | 420 |
| 4 | 80 | 180 | 420 |
| 5 | 120 | 960 | 420 |
| 6 | 140 | 840 | 420 |
| 7 | 130 | 720 | 420 |
| 8 | 160 | 660 | 420 |

Using the adhesive tapes, the change in the electric current characteristics after PCT tests are measured under the following conditions.

a. An adhesive tape having a size of 1 mm in width×5 mm in length is attached between the pins to be measured of 100-pin QFP lead frame.

b. The lead frame in a above is molded and dam bar is cut.

c. Voltage of 10 V is applied between the pins to be red, and initial leak current value is measured.

d. The samples for the measurement are treated with PCT (saturated type, 121° C/2 atm.) for 500 hours, and the leak current values after PCT 500 hours are measured in the same manner as in c above.

The results obtained are shown in Table 5 below.

TABLE 5

| Adhesive Tape Number | Initial Current Leak Value (A) | Current Leak Value After PCT 500 Hours (A) |
| --- | --- | --- |
| 1 | $1 \times 10^{-13}$ or less | $1 \times 10^{-12}$ |
| 2 | $1 \times 10^{-13}$ or less | $5 \times 10^{-12}$ |
| 3 | $1 \times 10^{-13}$ or less | $8 \times 10^{-10}$ |
| 4 | $1 \times 10^{-13}$ or less | $4 \times 10^{-10}$ |
| 5 | $1 \times 10^{-13}$ or less | $5 \times 10^{-10}$ |

TABLE 5-continued

| Adhesive Tape Number | Initial Current Leak Value (A) | Current Leak Value After PCT 500 Hours (A) |
|---|---|---|
| 6 | $1 \times 10^{-13}$ or less | $7 \times 10^{-9}$ |
| 7 | $1 \times 10^{-13}$ or less | $5 \times 10^{-9}$ |
| 8 | $1 \times 10^{-13}$ or less | $4 \times 10^{-9}$ |

EXAMPLE 2

Using NBR (1) and Phenol resin (4) shown in Table 2 above as the NBR and resol type phenol resins, test adhesive solutions 9 through 12 are prepared. The adhesive solutions are coated on Apical (polyimide film produced by Kanegafuchi Kagaku Kogyo Co., Ltd.) and Ultem (polyetherimide film produced by Mitsubishi Gas Chemical Co., Ltd.) each having a thickness of 50 $\mu$m so as to form a layer of a dry thickness of 25±5 $\mu$m, and dried at 165° C. for 3 minutes to prepare adhesive tapes 9 through 16. Table 6 shows the relationship between the heat resistant films used in the samples and the adhesive solutions.

TABLE 6

| Adhesive Tape Number | Name of Base Film | Adhesive Solution Number |
|---|---|---|
| 9 | Apical 50AH | 9 |
| 10 | Apical 50AH | 10 |
| 11 | Apical 50AH | 11 |
| 12 | Apical 50AH | 12 |
| 13 | Ultem 50 $\mu$m | 9 |
| 14 | Ultem 50 $\mu$m | 10 |
| 15 | Ultem 50 $\mu$m | 11 |
| 16 | Ultem 50 $\mu$m | 12 |

Adhesive Solution 9:

a. Deionized water (100 parts) is charged in a stainless steel vessel, to which is added 1 part of phenol resin (4). The mixture is stirred well and the phenol resin component which settles on the bottom of the vessel is collected, and placed in a vacuum drier at 50° C. under reduced pressure to remove water content. MEK (100 parts) is added to 100 parts of the phenol resin obtained after the removal of water to dissolve it well to obtain a phenol resin solution A.

b. To 100 parts of NBR is added 400 parts of MEK, and the mixture is stirred to well dissolve to obtain an NBR solution A.

c. To 100 parts of NBR solution A is added 250 parts of phenol resin solution A, and the mixture is well stirred.

d. The NBR-phenol resin mixed solution prepared in c above is introduced in a pressurized reactor, and stirred at 80° C. for 2 hours to obtain an adhesive solution 9. (The ratio of NBR:phenol resin is 100:625 in terms of the solid content.)

Adhesive Solution 10 a. To 100 parts of the NBR solution A used in the preparation of Adhesive Solution 9 above is added 100 parts of phenol resin solution A, and stirred well.

b. The NBR-phenol resin mixed solution prepared in a above is introduced in a pressurized reactor, and stirred at 80° C. for 2 hours to obtain an adhesive solution 10. (The ratio of NBR:phenol resin is 100:250 in terms of the solid content.)

Adhesive Solution 11 a. To 100 parts of the NBR solution A used in the preparation of Adhesive Solution 9 above is added 20 parts of phenol resin solution A, and stirred well.

b. The NBR-phenol resin mixed solution prepared in a above is introduced in a pressurized reactor, and stirred at 80° C. for 2 hours to obtain an adhesive solution 11. (The ratio of NBR:phenol resin is 100:50 in terms of the solid content.)

Adhesive Solution 12 a. To 100 parts of the NBR solution A used in the preparation of Adhesive Solution 9 above is added 77 parts of phenol resin solution (4), and stirred well.

b. The NBR-phenol resin mixed solution prepared in a above is introduced in a pressurized reactor, and stirred at 80° C. for 2 hours to obtain an adhesive solution 12. (The ratio of NBR:phenol resin is 100:250 in terms of the solid content.)

The adhesive tapes thus prepared are measured for the electric conductivity of extracted water, concentration of sulfate ions contained in the system, and adhesion strength between the heat resistant film and the molding compound are measured in the above-described manner. The results obtained are shown in Table 7 below.

TABLE 7

| Adhesive Tape Number | Electric Conductivity ($\mu$s/cm) | Concentration of Sulfate Ions (ppm) | Adhesion to Molding Material (kg/1.5 cm) |
|---|---|---|---|
| 9 | 28 | 130 | 420 |
| 10 | 23 | 100 | 420 |
| 11 | 25 | 70 | 420 |
| 12 | 78 | 110 | 420 |
| 13 | 18 | 220 | 150 |
| 14 | 14 | 180 | 150 |
| 15 | 10 | 210 | 150 |
| 16 | 40 | 220 | 150 |

Using the adhesive tapes, the change in the electric current characteristics after PCT tests are measured under the same conditions as in Example 1.

The results obtained are shown in Table 8 below.

TABLE 8

| Adhesive Tape Number | Initial Current Leak Value (A) | Current Leak Value After PCT 500 Hours (A) |
|---|---|---|
| 9 | Impossible to measure because of striping off of the adhesive layer from the base film. | |
| 10 | $1 \times 10^{-13}$ or less | $2 \times 10^{-12}$ to $8 \times 10^{-12}$ |
| 11 | $1 \times 10^{-13}$ or less | $1 \times 10^{-10}$ to $1 \times 10^{-9}$ |
| 12 | $1 \times 10^{-13}$ or less | $2 \times 10^{-10}$ to $3 \times 10^{-9}$ |
| 13 | Impossible to measure because of striping off of the adhesive layer from the base film. | |
| 14 | $1 \times 10^{-13}$ or less | $1 \times 10^{-12}$ to $7 \times 10^{-9}$ |
| 15 | $1 \times 10^{-13}$ or less | $8 \times 10^{-10}$ to $5 \times 10^{-7}$ |
| 16 | $1 \times 10^{-13}$ or less | $3 \times 10^{-10}$ to $4 \times 10^{-9}$ |

EXAMPLE 3

Using materials shown in Table 9 below and MEK as a solvent, adhesive solutions 13 through 17 are prepared which have blend ratios shown in Table 10 below.

TABLE 9

| Resin | Trade Name | Manufacturer |
| --- | --- | --- |
| NBR (3) | NIPOL 1031 | Nippon Zeon Co., Ltd. Note 1 |
| Phenol resin (1) | CKM-908 | Showa Kobunshi Kogyo Co., Ltd. Note 2 |
| Phenol resin (5) | CRM-0803 | Taoka Kagaku Kogyo Co., Ltd. Note 3 |
| Phenol resin (4) | KP732 E-2 | Arakawa Kagaku Kogyo Co., Ltd. Note 4 |

Note 1: NBR synthesized by Nippon Zeon Co., Ltd. which has the following properties. Mooney viscosity: 63, bonded acrylonitrile content: 41%. Weight average molecular weight/number average molecular weight = 4.2.
Note 2: Bisphenol A type resol phenol resin produced by Showa Kobunshi Kogyo Co., Ltd., having a softening point of 70 to 90° C.
Note 3: p-Nonylphenyl type resol phenol resin (alkylphenol type resol phenol resin) produced by Showa Kobunshi Kogyo Co., Ltd., having a softening point of 82 to 90° C.
Note 4: Resol phenol resin produced by Arakawa Kagaku Kogyo Co., Ltd. which is a liquid low molecular weight resin containing phenol type structure as a basic structure, having the following properties. Volatile component with methanol/isopropyl alcohol: about 3.5%. Viscosity at 25° C.: 245 cps. Gelling time at 140° C.: about 8 minutes.

TABLE 10

| Adhesive solution Number | Blend Ratio of Materials (Parts by Weight). | | | | |
| --- | --- | --- | --- | --- | --- |
| | NIPOL 1031 | CKM -908 | CRM 0803 | KP732 E-2 | MEK. |
| 13 | 100 | 150 | — | — | 500 |
| 14 | 100 | — | 150 | — | 500 |
| 15 | 100 | — | — | 200 | 500 |
| 16 | 100 | 20 | — | — | 500 |
| 17 | 100 | 500 | — | — | 500 |

Figure 7:
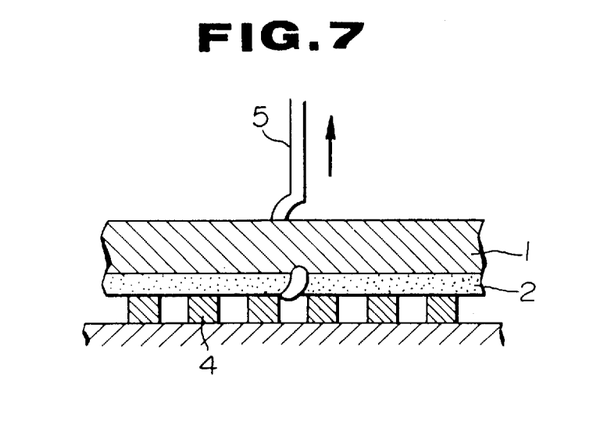
FIG. 7 is a view illustrating the method of peeling tests used in examples of this invention.

The resulting adhesive solutions 13 through 17 are coated on one surface of respective polyimide films having a thickness of 50 μm ("Upilex 50S", produced by Ube Kosan Co., Ltd.) to a thickness of 20 μm, and dried at 160° C. for 3 minutes to prepare adhesive tapes 17 through 21. Simulating the taping with adhesive tapes represented by those for fixing lead frame, the adhesive tapes thus-obtained are attached to 42-pin 42-alloy lead frame and pressurized for 0.3 second under the conditions of an application size of 1.5 mm in width×10 mm in length at a temperature of 200° C. and a pressure of 4 kg·f/cm² to perform taping. The adhesion strength at room temperature immediately after the taping and decrease in the adhesion strength after heating at 250° C. for 1 hour (hereafter, "adhesion strength after thermal hysteresis") are examined by measuring the peel strength of the tapes using a universal testing machine in the manner as shown in FIG. 7. That is, an adhesive tape composed of the heat resistant film 1 having laminated thereon the adhesive layer 2 is attached to a plurality of pins 4 fixed on the lead frame and the adhesive tape is hung on a member for engagement or hook 5 positioned between the pins in the central portion of the lead frame as shown in FIG. 7. Then the hook 5 is pulled up in the direction at right angles to the plane of adhesion to measure the peel strength of the adhesive tapes. The results obtained are shown in Table 11 below.

TABLE 11

| Adhesive Tape Number | Adhesion at Room Temp. After Taping (g) | Adhesion After Thermal Hysteresis | Evaluation |
| --- | --- | --- | --- |
| 17 | 580 | 570 | Fair |
| 18 | 530 | 610 | Fair |
| 19 | 250 | 190 | Poor |
| 20 | 450 | 580 | Poor Surface Property |
| 21 | 150 | 100 | Poor |

As will be clear from the results in Table 11 above, the adhesive tapes 17 and 18 of this invention exhibit sufficient adhesion and fair surface properties. On the other hand, the adhesive tapes of the comparative examples 19 and 21 show poor adhesion. The adhesive tape of the comparative example 20 shows sufficient adhesion but the surface of its adhesive layer is blocking and the surface property thereof is poor and practically unacceptable.

EXAMPLE 4

Using materials shown in Table 12 below and MEK as a solvent, adhesive solutions 18 and 19 are prepared which have blend ratios shown in Table 13 below.

TABLE 12

| Resin | Trade Name | Manufacturer |
| --- | --- | --- |
| NBR (4) | DN1031 | Nippon Zeon Co., Ltd. Note 5 |
| NBR (5) | D-8161 | Nippon Zeon Co., Ltd. Note 6 |
| Phenol resin (5) | BKM-2620 | Showa Kobunshi Kogyo Co., Ltd. Note 7 |

Note 5: NBR synthesized by Nippon Zeon Co., Ltd. which has the following properties. Mooney viscosity: 63, bonded acrylonitrile content: 41%. Number average molecular weight: about 73,000. Weight average molecular weight/number average molecular weight = 4.15
Note 6: NBR synthesized by Nippon Zeon Co., Ltd. which has the following properties. Softening point: 70 to 90° C. Mooney viscosity: 73, bonded acrylonitrile content: 40%. Weight average molecular weight/number average molecular weight = 4.15
Note 7: Cresol type phenol resin (alkylphenol type resol phenol resin) produced by Showa Kobunshi Kogyo Co., Ltd. having a softening point of 80 to 100° C.

TABLE 13

| Adhesive solution Number | Blend Ratio of Materials (Parts by Weight) | | | |
| --- | --- | --- | --- | --- |
| | DN-1031 | D-8161 | BRM-2620 | MEK. |
| 18 | 100 | — | 200 | 500 |
| 19 | — | 100 | 200 | 500 |

The resulting adhesive solutions 18 and 19 are coated on one surface of respective polyimide films having a thickness of 50 μm ("Apical 50AH", produced by Kanegafuchi Kagaku Kogyo Co., Ltd.) to a dry thickness of 20 μm, and dried at 160° C. for 3 minutes to prepare adhesive tapes 22 and 23. Simulating the taping with adhesive tapes represented by those for fixing lead frame, the adhesive tapes thus-obtained are attached to 42-pin copper-alloy lead frame and pressurized for 0.3 second under the conditions of an application size of 1.5 mm in width×10 mm in length at a temperature of 200° C. and a pressure of 4 kg·f/cm² to perform taping. The adhesion strength at room temperature immediately after the taping and decrease in the adhesion strength after heating at 250° C. for 1 hour (hereafter, "adhesion strength after thermal hysteresis") are examined by measuring the peel strength of the tapes using a universal testing machine in the same manner as in Example 3. The results obtained are shown in Table 14 below.

TABLE 14

| Adhesive Tape Number | Adhesion at Room Temp. After Taping (g) | Adhesion After Thermal Hysteresis | Evaluation |
|---|---|---|---|
| 22 | 550 | 470 | Fair |
| 23 | 230 | 110 | Poor |

As will be clear from the results in Table 14 above, the adhesive tape 22 of this invention exhibits sufficient adhesion as compared with the comparative adhesive tape 23.

EXAMPLE 5

On various base films shown in Table 15 is coated an acrylic based adhesive (Teisan Resin SG-70L, produced by Teikoku Kagaku Sangyo Co. Ltd.) as the adhesive, and the coated base films are dried in a drier in which hot air is circulated at 150° C. for 10 minutes to form B-stage adhesive layers of a thickness of 15±2 μm. The adhesive sheets thus obtained are cut to pieces of a size of 20 mm and 17 mm in width, respectively, along the direction of running of the base film (the direction of the machine) to obtain adhesive tapes, which are used as samples for the measurement of lead shift. Using the adhesive tapes, the lead shift is measured in the following manner. The results obtained are shown in Table 16 below.

(1) Samples

Adhesive tape to be measured is cut to a width of 17 mm or 20 mm along the direction of running of the base film (the direction of the machine).

(2) Lead frame to be measured

As the lead frame for measuring the lead shift used 128-pin QFP lead frame. The distance (A) between the portions of the lead frame shown in FIG. 6(a) is measured with a measurement limit of 1 μm prior to measurement of the lead shift. The value obtained is named "A".

(3) Taping

Taping is conducted using 4-directional taping machine produced by Sumitomo Kinzoku Kozan Co., Ltd.as a lead frame taping machine.

(4) Heat Treatment

The lead frame subjected to the taping is then heat treated at 300° C. for 3 minutes on a hot plate, supposing thermal hysteresis of the semiconductor devices in the assembly step.

(5) Measurement of Lead Shift

The distance (B) between the portions shown in FIG. 6(b) is measured with a measurement limit of 1 μm, and the value obtained is named "B". Then, the lead shift ratio α (%) is calculated according to the following equation.

$$\alpha = \frac{(B-A) \times 100}{A}$$

TABLE 15

| Sample | Base Film | Composition | Thickness (μm) |
|---|---|---|---|
| 1 | Upilex S (Ube Kosan) | Polyimide | 50 |
| 2 | Upilex S (Ube Kosan) Treated at 300° C. for 5 minutes | Polyimide | 50 |
| 3 | Kapton 200H (Toray Du Pont) | Polyimide | 50 |
| 4 | Apical 50AH (Kanegafuchi Kagaku) | Polyimide | 50 |

| Sample | Coefficient of Thermal Expansion (cm/cm/°C.) | Degree of Thermal Shrinkage (%) | Note |
|---|---|---|---|
| 1 | $1.6 \times 10^{-5}$ | 0.33 | |
| 2 | $1.6 \times 10^{-5}$ | 0.10 | Both surfaces heat treated with infrared heater |
| 3 | $3.4 \times 10^{-5}$ | 0.25 | |
| 4 | $3.2 \times 10^{-5}$ | 0.03 | |

TABLE 16

| Sample Number | Ratio of Lead Shift | Evaluation | Note |
|---|---|---|---|
| 1 | 11.5 | Poor | Comparison |
| 2 | 4.0 | Fair | Invention |
| 3 | 14.3 | Poor | Comparison |
| 4 | 13.2 | Poor | Comparison |

The results shown in Table 16 clearly indicate that the sample of this invention has low lead shift ratio.

EXAMPLE 6

On various base films shown in Table 17 is coated a nylon based adhesive (Toresin FS-410, produced by Teikoku Kagaku Sangyo Co. Ltd.) as the adhesive, and the coated base films are dried in a drier in which hot air is circulated at 150° C. for 10 minutes to form B-stage adhesive layers of a thickness of 25±2 μm. The adhesive sheets thus obtained are cut to pieces of a size of 20 mm and 17 mm in width, respectively, along the direction of running of the base film (the direction of the machine) to obtain adhesive tapes, which are used as samples for the measurement of lead shift. Using the adhesive tapes, the lead shift is measured in the same manner as in Example 5.

The results obtained are shown in Table 18 below.

TABLE 17

| Sample | Base Film | Composition | Thickness (μm) |
|---|---|---|---|
| 5 | CCLHL800 (Mitsubishi Gas Chemical) Treated at 330° C. for 30 minutes | Glass cloth | 100 |
| 6 | Upilex 50R (Ube Kosan) | Polyimide | 50 |
| 7 | Kapton 100 V (Toray Du Pont) | Polyimide | 25 |

TABLE 17-continued

| Sample | Coefficient of Thermal Expansion (cm/cm/°C.) | Degree of Thermal Shrinkage (%) | Note |
|---|---|---|---|
| 5 | $1.5 \times 10^{-5}$ | 0.10 | Heat treated in a drier in which hot air is circulated |
| 6 | $8.2 \times 10^{-5}$ | 0.63 | |
| 7 | $3.2 \times 10^{-5}$ | 0.12 | Heat treated, low shrinkage grade |

TABLE 18

| Sample Number | Ratio of Lead Shift | Evaluation | Note |
|---|---|---|---|
| 5 | 5.9 | Fair | Invention |
| 6 | 24.3 | Poor | Comparison |
| 7 | 12.1 | Poor | Comparison |

The results shown in Table 18 clearly indicate that the sample of this invention has low lead shift ratio.

EXAMPLE 7

On base films made of Apical 50AH (polyimide films, thickness: 50 μm, produced by Kanegafuchi Kagaku Co., Ltd.) is coated a mixture of an acrylic based adhesive (Teisan Resin SG-70L, produced by Teikoku Kagaku Sangyo Co. Ltd.) as the adhesive blended with the filler shown in Table 19 below and dispersed therein. The coated base films are dried in a drier in which hot air is circulated at 150° C. for 10 minutes to form B-stage adhesive layers of a thickness of 15±2 μm. The adhesive sheets thus obtained are cut to pieces of a size of 20 mm and 17 mm in width, respectively, along the direction of running of the base film (the direction of the machine) to obtain adhesive tapes, which are used as samples for the measurement of lead shift. Using the adhesive tapes, the lead shift is measured in the same manner as in Example 5 except that the thickness of the adhesive layer is 5 μm in samples 8 through 11 and 0.5 μm in sample 5. The results obtained are shown in Table 20 below.

TABLE 19

| Sample Number | Adhesive | Filler | Ratio of Filler Added | Method of Dispersion |
|---|---|---|---|---|
| 8 | Teisan Resin SG70-L | ZrB$_2$-F (Zirconium boride) Nippon Shin-Kinzoku Co., Ltd. | 20 | Sand mill |
| 9 | Teisan Resin SG70-L | MBN-250 (Boron nitride) Mitsui Toatsu Kagaku Co., Ltd. | 20 | Sand mill |
| 10 | Teisan Resin SG70-L | RSG (Magnesium oxide) Tateho Kagaku Co., Ltd. | 20 | Sand mill |
| 11 | Teisan Resin SG70-L | MT-10 (Silica) Tokuyama Soda Co., Ltd. | 20 | Sand mill |
| 12 | Teisan Resin SG70-L | Tosval120 (Silicone resin powder Toshiba Silicone Co., Ltd. | — | — |

TABLE 20

| Sample Number | Ratio of Lead Shift | Evaluation | Note |
|---|---|---|---|
| 8 | 5.0 | Fair | Invention |
| 9 | 4.8 | Fair | Invention |
| 10 | 5.2 | Fair | Invention |
| 11 | 4.5 | Fair | Invention |
| 12 | 5.9 | Fair | Invention |
| 13 | 13.2 | Poor | Comparison |

The results shown in Table 20 above clearly show that the addition of the filler reduces the lead shift ratio to a greater extent.

EXAMPLE 8

On various base films shown in Table 21 is coated a nylon based adhesive (Toresin FS-410, produced by Teikoku Kagaku Sangyo Co. Ltd.) as the adhesive, and the coated base films are dried in a drier in which hot air is circulated at 150° C. for 10 minutes to form B-stage adhesive layers of a thickness of 25±2 μm. The adhesive sheets thus obtained are cut to pieces of a size of 20 mm and 17 mm in width, respectively, along the direction of running of the base film (the direction of the machine) to obtain adhesive tapes, which are used as samples for the measurement of lead shift. Using the adhesive tapes, the lead shift is measured in the same manner as in Example 7.

The results obtained are shown in Table 22 below.

TABLE 21

| Sample | Base Film | Composition | Thickness (μm) |
|---|---|---|---|
| 14 | Kapton 200 V (Toray Du Pont) | Polyimide | 50 |
| 15 | Kapton 200 V (Toray Du Pont) | Polyimide | 50 |
| 16 | Kapton 200 V (Toray Du Pont) | Polyimide | 50 |
| 17 | Upilex 50S (Ube Kosan) | Polyimide | 50 |
| 18 | Upilex 50S (Ube Kosan) | Polyimide | 50 |
| 19 | Upilex 50S (Ube Kosan) | Polyimide | 50 |
| 20 | CCLHL800 (Mitsubishi Gas Chemical) | Glass cloth/ polyimide | 100 |
| 21 | CCLHL800 (Mitsubishi Gas Chemical) | Glass cloth/ polyimide | 100 |
| 22 | CCLHL800 (Mitsubishi Gas Chemical) | Glass cloth/ polyimide | 100 |

| Sample Number | Filler | Filler Added |
|---|---|---|
| 14 | SE-5 (Fused silica) Tokuyama Soda Co., Ltd. | 30 |
| 15 | SE-5 (Fused silica) Tokuyama Soda Co., Ltd. | 10 |
| 16 | — | 0 |
| 17 | SE-5 (fused silica) Tokuyama Soda Co., Ltd. | 30 |
| 18 | SE-5 (fused silica) | 10 |
| 19 | — | 0 |
| 20 | SE-5 (fused silica) Tokuyama Soda Co., Ltd. | 30 |
| 21 | SE-5 (fused silica) | 10 |
| 22 | — | 0 |

TABLE 22

| Sample Number | Ratio of Lead Shift | Evaluation | Note |
| --- | --- | --- | --- |
| 14 | 7.9 | Fair | Invention |
| 15 | 9.0 | Fair | Invention |
| 16 | 18.6 | Poor | Comparison |
| 17 | 8.4 | Fair | Invention |
| 18 | 8.8 | Fair | Invention |
| 19 | 19.5 | Poor | Comparison |
| 20 | 5.2 | Fair | Invention |
| 21 | 6.7 | Fair | Invention |
| 22 | 16.6 | Poor | Comparison |

The results shown in Table 22 clearly indicate that the samples 14. 15. 17, 18, 20 and 21 of this invention has low lead shift ratios.

What is claimed is:

1. A method of compensating for a shift of lead pins, comprising the steps of:

adhering an adhesive tape comprising non-thermoplastic resin to lead pins; and compensating for the shift of the lead pins by providing the adhesive tape with a heat resistant base film having an average coefficient of linear thermal expansion along the width thereof at from 20° to 300° C. (as measured according to ASTM D-696-44) of from $0.4 \times 10^{-5}$ to $2.5 \times 10^{-5}$ cm/cm/° C. and a coefficient of dimensional change along the width thereof after heating at 300° C. for 3 minutes (as measured according to JIS C2318-6.3.5) being not higher than 0.15%, the step of adhering arising with an adhesive layer laminated on at least one surface of the base film.

2. The method as claimed in claim 1, further comprising passing the base film between heated rollers at a temperature of from 290° to 360° C. for from 1 to 10 minutes while keeping the film in contact with a surface of the rollers before commencing the step of adhering.

3. An method as claimed in claim 1, wherein said heat resistant base film is comprised of a material selected from the group consisting of polyimides, polyetherimides, polyphenylene sulfides, polyether-ether-ketones, polyparabic acid, epoxy resin/glass cloth, epoxy resin/polyimide/glass cloth, glass cloth, and glass cloth/polyimide.

4. A method as claimed in claim 1, further comprising the step of passing said heat resistant base film through two opposing infrared heaters heated at a temperature within a range of 280° to 360° C. for 1 to 10 minutes, while maintaining these conditions, before the step of adhering.

5. A method as claimed in claim 1, further comprising the step of keeping said heat resistant base film in a drier, in which the hot air temperature is within a range of 280° to 360° C., for 1 to 10 minutes before the step of adhering.

* * * * *